United States Patent [19]

Tanaka

[11] 4,329,700
[45] May 11, 1982

[54] SEMI-CONDUCTOR INVERTER USING COMPLEMENTARY JUNCTION FIELD EFFECT TRANSISTOR PAIR

[75] Inventor: Kojiro Tanaka, Tokyo, Japan

[73] Assignee: Kabushiki Kaisha Daini Seikosha, Tokyo, Japan

[21] Appl. No.: 127,182

[22] Filed: Mar. 4, 1980

Related U.S. Application Data

[63] Continuation of Ser. No. 903,012, May 4, 1978, abandoned.

[30] Foreign Application Priority Data

May 4, 1977 [JP] Japan ............................... 52/51468

[51] Int. Cl.³ ........................................... H01L 29/80
[52] U.S. Cl. ..................................... 357/22; 357/41; 357/42

[58] Field of Search ........................... 357/22, 41, 42; 307/448, 451, 571

[56] References Cited

U.S. PATENT DOCUMENTS 4,039,862  8/1977  Dingwall et al. .................. 307/571
4,064,525 12/1977  Kano et al. ........................ 357/22
4,115,740  9/1978  Yoshida et al. ................... 357/22

Primary Examiner—Edward J. Wojciechowicz
Attorney, Agent, or Firm—Robert E. Burns; Emmanuel J. Lobato; Bruce L. Adams

[57] ABSTRACT

A semiconductor inverter comprised of a pair of junction field effect transistors. A first of the junction field effect transistors is a lateral transistor, and a second of the junction field effect transistors is a vertical transistor. The two junction field transistors have respective channels of opposite conductivity type.

3 Claims, 9 Drawing Figures

SEMI-CONDUCTOR INVERTER USING COMPLEMENTARY JUNCTION FIELD EFFECT TRANSISTOR PAIR

This is a continuation of application Ser. No. 903,012, filed May 4, 1978, now abandoned.

BACKGROUND OF THE INVENTION

The present invention relates to an inverter comprised of complementary type junction field-effect transistors having different conductive channel polarities. Heretofore, in various electronic apparatus, semiconductor devices comprising the electronic circuits thereof are formed in integrated circuits(called IC below) such as CMOS, IIL and the like. The main objects of utilizing IC structure in the electronic circuits are to realize the following circuits;
1. Low driving power circuit
2. High speed operating circuit
3. Highly reliable circuit
4. Low cost circuit
5. Multi-function circuit and etc.

Especially when all of the electronic circuits should be built in a limited space such as in an electronic wrist watch, low power ICs are particularly required for lengthening the operation life of a single electric cell in order to restrict the size of said electric cell. At present, in the case of using a 50 m AH electric cell, a two (2) year continuous operating life has been realized. But according to generally increasing requirements, the continuous operating life of the electric power cell will be required to be further extended to 5–10 years.

Furthermore, in the field of electronic watches the demand for high accuracy has been increasing. Presently the typical quartz crystal watch uses a quartz crystal vibrator of 32 KHz as a source of a standard time signal, and the timekeeping error can be kept within about 10-seconds per month. But when an AT-cut quartz crystal vibrator of 4 MHz is used as a source of the standard time signal, timekeeping the error can be reduced to within 10-seconds per year. And also in the field of digital watches, the multi-function operations which they perform have required complex circuitry and at present a watch using an IC composed of about 10,000 transistor elements has been realized as a chronograph or a world timer. If all of the above requirements are to be satisfied at one time in a highly efficient electronic watch, it can not be realized by using conventional IC structure. This is because a conventional IC can not operate at the high speed of the 4 MHz ranges in the case of CMOS. Even if it should operate at this speed, it requires about 1,000 times the power of the case of 32 KHZ operation.

In the case of IIL, the power requirements of a static logic circuit during non-operation are in proportion of the number of gates of the circuit and becomes about several ten figure times at using 10,000 gates IC compared to that of CMOS. That is to say, it is impossible to manufacture a high performance electronic watch as described above by using the conventional IC, CMOS or IIL because of the high power consumption thereof.

The main object of this invention is to provide an IC which enables realization of a highly efficient electronic watch. Another object is to provide an IC having a low power consumption and able to be used in various electronic devices.

The essential point of this invention is to realize a semiconductor device that is a logic circuit (below only called CJL) comprised of complementary junction type field-effect transistors having different channel polarities each other.

DESCRIPTION OF THE PREFERRED EMBODIMENT

Figure 1A:
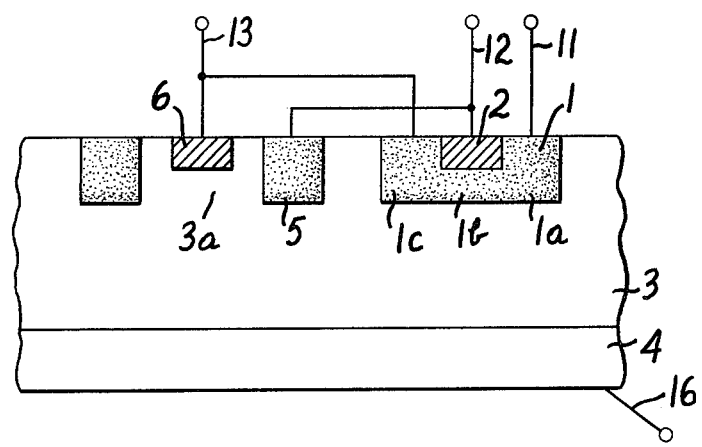
FIG. 1(a) is a cross-sectional view of a CJL inverter according to the present invention.
Figure 1B:
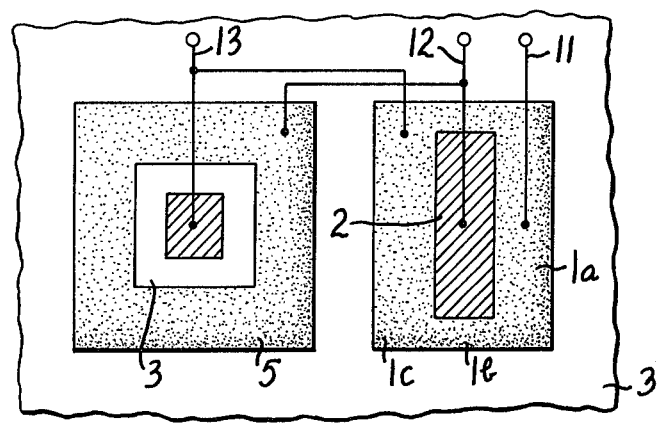
FIG. 1(b) is a plan view of the CJL inverter illustrated in FIG. 1(a)
Figure 1C:
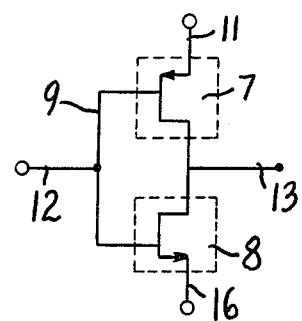
FIG. 1(c) is the equivalent circuit of the CJL inverter illustrated in FIGS. 1(a) and 1(b)

FIGS. 1(a)–1(c) show an embodiment of CJL inverter wherein FIG. 1(a) is a sectional view of said inverter, FIG. 1(b) is a plan view thereof and FIG. 1(c) is an equivalent circuit thereof.

Figure 2A:
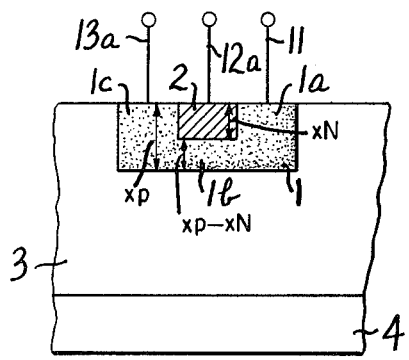
FIGS. 2(a), 2(b) and 2(c) respectively illustrate the lateral transistor in cross section, plan, and the equivalent circuit thereof.
Figure 2B:
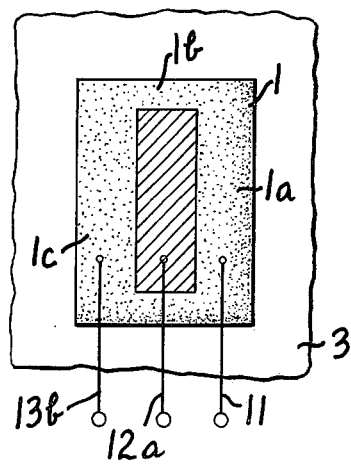
Figure 2C:
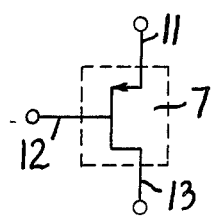

The said inverter is composed of a P-channel transistor 7 and a N-channel transistor 8. In FIG. 2, the P-channel transistor 7 is shown separately. As shown in FIG. 2, the P-channel transistor 7 is a lateral type junction field transistor having a N-type semiconductor gate 2 of $10^{19}$ impurity concentration for an instance as a gate thereof. The source electrode 11 is in ohmic contact with the P-type semiconductor 1a serving as source thereof and also the drain electrode 13a is in ohmic contact with the P-type semi-conductor 1c serving as the drain thereof. The gate electrode 12a is in ohmic contact with the gate 2.

Figure 3A:
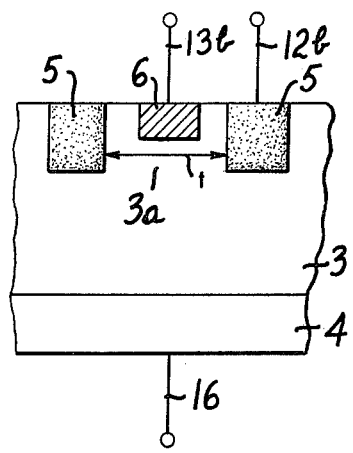
FIGS. 3(a), 3(b) and 3(c) respectively illustrate the vertical transistor in cross section, plan, and the equivalent circuit thereof.
Figure 3B:
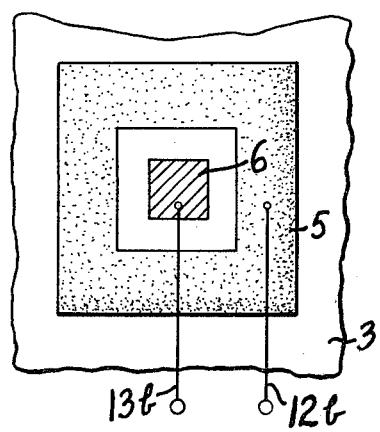
Figure 3C:
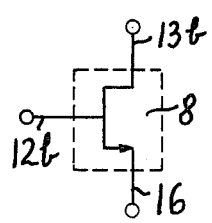

The N-channel transistor 8 is shown in FIGS. 3(a)–3(c). The N-channel transistor 8 is a vertical type junction field transistor having a N-type semiconductor 3a, having an impurity concentration of $10^{18}$ atoms cm$^3$ for examples, defining a channel thereof and a P-type semiconductor 5, having an impurity concentration of $10^{15}$ atoms/cm$^3$ for example, defining a gate thereof. The source electrode 16 is drawn out from the IC-substrate 4, the drain electrode 13b is in ohmic contact with a N-type semiconductor 6 and the gate electrode 12b is drawn out from the said gate 5. In FIG. 1 showing the said CJL inverter the source electrode 11 of transistor 7 and the source electrode 16 of transistor 8 are connected to positive and negative potentials, respectively, and the drain electrodes 13a and 13b are drawn out as one input electrode 13 and the gate electrodes 12a and 12b are drawn out as one input electrode 12.

Now, for explaining that the inverter according to the present invention operates like the conventional CMOS inverter, the operations of the transistors 7 and 8 will be described with reference to FIGS. 2 and 3 as follows. The P-channel transistor 7 shown in the FIG. 2 should be designed so as to make said transistor 7 non-conductive by closing the channel just when the voltage VG of gate 2 is equal to the source voltage. When the impurity concentrations the channel and the gate are respectively $10^{15}$ and $10^{19}$ atoms/cm$^3$, the expansion of the resulting deplection layer is approximately 0.89 $\mu$m. Accordingly, if the difference of the depth of diffusion Xp of the P-type semiconductor 1 comprising the source, drain and channel regions and the depth of diffusion Xn' of N-type semiconductor 2 comprising the gate is smaller than 0.89 μm, the P-channel transistor 7 can be made non-conductive.

When the breadth of the depletion layer is reduced by lowering the gate voltage VG to a value lower than the source voltage, the P-channel transistor 7 can be made conductive by the expansion of the channel. When the said diffusion difference Xp−Xn is equal to 0.8 μm, the breadth of channel 1b becomes 0.23 μm by lowering the gate voltage to 0.5 V lower than the source voltage.

The N-channel transistor 8 in FIG. 3 should be designed so as to make said transistor 8 non-conductive by closing the channel just when the gate voltage is equal to the source voltage. If the impurity concentration of the N-semiconductor 3 forming channel 3a is $10^{13}$ atoms/cm$^3$ and that of the P-semiconductor 5 forming the gate 5 is $10^5$ atoms/cm$^3$, the inside distance t between the gate 5 should be decided as the expansion of depletion layer becomes 7.16 μm at this time and the breadth of channel of transistor 8 become smaller than 14.3μm.

Conversely, if the depletion layer of said channel is reduced by raising the gate voltage to a value higher than the source voltage, the N-channel transistor 8 can be made conductive by the expansion of the channel.

When the inside interval distance t of the gate 5 is 14 μm, the breadth of channel 3a becomes 10 μm by rising increasing the gate voltage to 0.5 V a value 0.5 V higher than the source voltage.

By combining the two complementary transistors described above, the structure of an inverter is realized as shown in FIG. 1. In operation 0V is applied to the power-supply terminal 16 of said inverter 9 and 0.5 V is applied to the other power supply terminal 11, for example. Under this condition, if 0.5 V ("H") is applied to the input terminal 12, the output terminal 13 potential becomes 0V ("L") and if 0V ("L") is applied to the said input terminal 12, the said outupt terminal 13 potential becomes 0.5 V ("H").

Among the excellent features of these CJL inverters which are improvements over other ICs are as the following;

1. The junction capacitance is small because of the low impurity concentration. (In the IIL, the low impurity concentration semiconductor can not be essentially used as base and emitter due to the use of bipolar transistors therein.)

2. The gate capacitance does not have as large a value as that of CMOS.

3. It can be used at sufficient low voltage since the operating voltage is able to be changed by the fabricating technique of the IC.

As described above, the CJL according to the present invention can readily be applied to an electronic wrist watch or the like requiring high speed operation thereof because of its small junction capacitance, it is to drive a quartz crystal vibrator thereof at 4 MHz with low electric power and is also able to drive a large circuit with low power since a static current is very low because of the complementary type structure. Therefore, a highly efficient electronic wrist watch can be realized by using such a CJL which operates at high speed in a highly integrated circuit with low electric power. Further, it is obvious that the CJL of this invention is useful for other small electronic devices.

What I claim:

1. A complementary semiconductor integrated inverter circuit, comprising: a semiconductor substrate of one conductivity type having a high impurity concentration; an epitaxial semiconductor layer of the same conductivity type as said substrate formed on said substrate and having a low impurity concentration; a first semiconductor region of the same conductivity type as the substrate formed in a surface portion of said epitaxial layer; a second semiconductor region of the opposite conductivity type formed in a surface portion of said epitaxial layer around said first region and having a high impurity concentration; a third semiconductor region of the same conductivity type as said second region formed in a surface portion of said epitaxial layer a short distance from said second region; a fourth semiconductor region of the same conductivity type as said substrate formed in a surface portion of said third region; said substrate, first region, the portion of said epitaxial layer under said first region, and second region forming respectively the source, drain, channel and gate regions of a vertical junction field effect transistor; the third region further consisting of one end portion, another end portion and a center portion under said fourth region; said one end portion, other end portion, center portion and fourth region forming respectively the drain, source, channel and gate regions of a lateral juntion field effect transistor; input terminal means electrically connecting the respective gate regions of said vertical and lateral junction field effect transistors for defining an input terminal effective to apply an input signal applied thereto to both of said gate regions; and output terminal means electrically connecting the respective drain regions of said vertical and lateral junction field effect transistors for defining an output terminal effective to develop thereat an output signal from both of said drain regions.

2. A complementary semiconductor integrated inverter circuit according to claim 1, wherein said fourth semiconductor region has an impurity atom concentration on the order of $10^{19}$ atom/cm$^3$.

3. A complementary semiconductor integrated inverter circuit according to claim 1 or 2, wherein said second semiconductor region has an impurity concentration on the order of $10^{15}$ atoms/cm$^3$ and said epitaxial semiconductor layer has a concentration on the order of $10^{18}$ atoms/cm$^3$.

* * * * *